United States Patent
Tanaka

(10) Patent No.: US 9,815,093 B2
(45) Date of Patent: Nov. 14, 2017

(54) SUBSTRATE PROCESSING APPARATUS AND SUBSTRATE PROCESSING METHOD

(71) Applicant: SCREEN Holdings Co., Ltd., Kyoto (JP)

(72) Inventor: Takayoshi Tanaka, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/381,820

(22) Filed: Dec. 16, 2016

(65) Prior Publication Data

US 2017/0095842 A1    Apr. 6, 2017

Related U.S. Application Data

(62) Division of application No. 13/834,906, filed on Mar. 15, 2013.

(30) Foreign Application Priority Data

Jun. 13, 2012 (JP) .................................. 2012-134083
Jan. 23, 2013 (JP) .................................. 2013-010461

(51) Int. Cl.
| | | |
|---|---|---|
| B08B 3/00 | (2006.01) | |
| B08B 3/10 | (2006.01) | |
| C11D 3/00 | (2006.01) | |
| B08B 7/00 | (2006.01) | |
| B08B 3/08 | (2006.01) | |
| H01L 21/02 | (2006.01) | |
| H01L 21/67 | (2006.01) | |
| H01L 21/687 | (2006.01) | |
| H01L 21/683 | (2006.01) | |

(52) U.S. Cl.
CPC ............... *B08B 3/10* (2013.01); *B08B 3/003* (2013.01); *B08B 3/08* (2013.01); *B08B 7/0035* (2013.01); *C11D 3/0094* (2013.01); *H01L 21/02052* (2013.01); *H01L 21/67051* (2013.01); *H01L 21/67109* (2013.01); *H01L 21/6838* (2013.01); *H01L 21/68764* (2013.01)

(58) Field of Classification Search
None
See application file for complete search history.

(56) References Cited

U.S. PATENT DOCUMENTS

| | | | |
|---|---|---|---|
| 6,090,217 A * | 7/2000 | Kittle | H01L 21/67028 134/11 |
| 7,958,899 B2 | 6/2011 | Tanaka | 134/157 |
| 2006/0137719 A1 | 6/2006 | Hasegawa et al. | 134/25.4 |
| 2006/0266382 A1 | 11/2006 | Matsubara | 134/33 |
| 2007/0000518 A1 * | 1/2007 | Korolik | G03F 7/422 134/21 |

(Continued)

FOREIGN PATENT DOCUMENTS

| | | |
|---|---|---|
| JP | 3-503975 A | 9/1991 |
| JP | 2005-158913 A | 6/2005 |

(Continued)

*Primary Examiner* — Michael Kornakov
*Assistant Examiner* — Ryan Coleman
(74) *Attorney, Agent, or Firm* — Ostrolenk Faber LLP

(57) ABSTRACT

A substrate processing method using a cleaning liquid containing a foaming agent that foams due to application of foaming energy, and including a foaming energy supplying step of applying the foaming energy to the cleaning liquid in contact with the substrate to clean the substrate.

5 Claims, 6 Drawing Sheets

(56) References Cited

U.S. PATENT DOCUMENTS

| | | | |
|---|---|---|---|
| 2007/0125405 A1 | 6/2007 | Sekiguchi | 134/34 |
| 2007/0235062 A1 | 10/2007 | Fujiwara et al. | 134/4 |
| 2008/0060686 A1 | 3/2008 | Miya et al. | 134/37 |
| 2011/0155180 A1 | 6/2011 | Moon | 134/30 |

FOREIGN PATENT DOCUMENTS

| | | |
|---|---|---|
| JP | 2006-179764 A | 7/2006 |
| JP | 2006-181426 A | 7/2006 |
| JP | 2007-281358 | 10/2007 |
| JP | 2008-021672 A | 1/2008 |
| JP | 2008-021891 | 1/2008 |
| JP | 2008-028008 | 2/2008 |
| JP | 2008-071875 | 3/2008 |
| JP | 2008-159728 | 7/2008 |
| JP | 2008-235737 | 10/2008 |
| JP | 2009-021409 | 1/2009 |
| JP | 2009-049126 | 3/2009 |
| JP | 2009-254965 | 11/2009 |
| JP | 2010-027816 | 2/2010 |
| JP | 2010-080819 | 4/2010 |
| JP | 2010-123835 | 6/2010 |
| JP | 2011-159665 | 8/2011 |
| JP | 2011-198894 | 10/2011 |
| JP | 2011-204712 | 10/2011 |
| JP | 2011-210933 | 10/2011 |
| JP | 2011-228364 | 11/2011 |
| JP | 2011-228365 | 11/2011 |
| WO | WO 89/10803 | 11/1989 |

\* cited by examiner

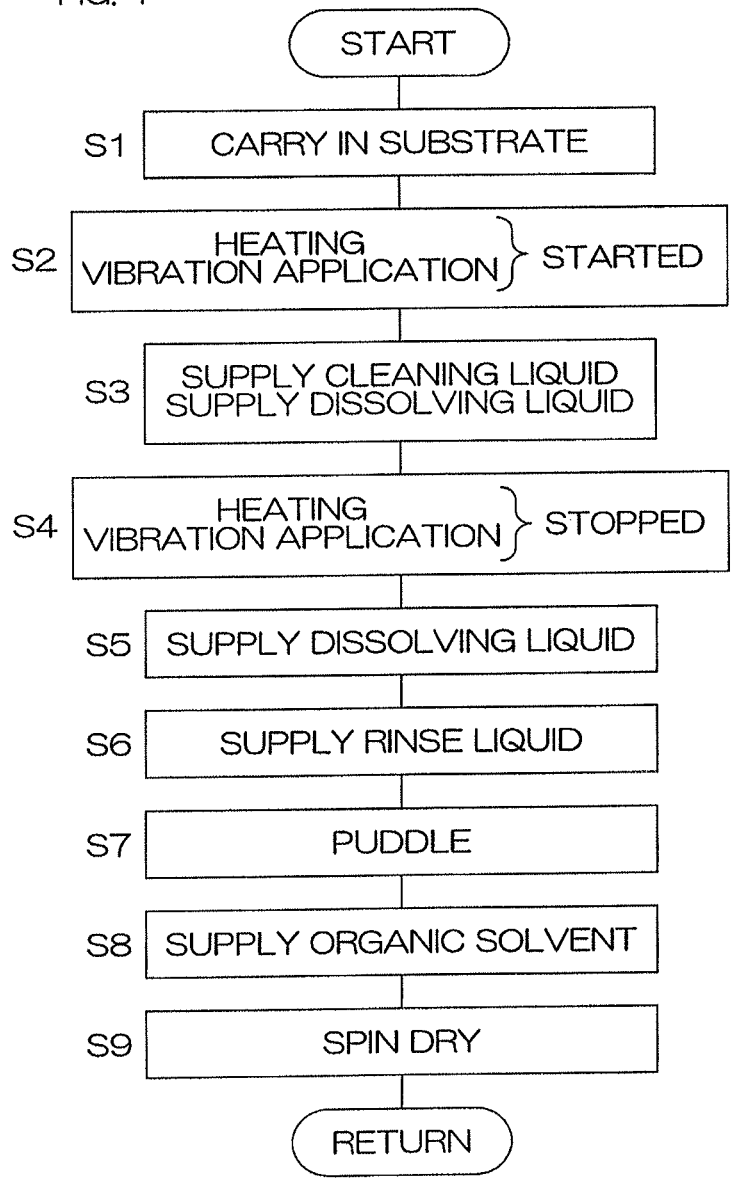

SUBSTRATE PROCESSING APPARATUS AND SUBSTRATE PROCESSING METHOD

CROSS-REFERENCE TO RELATED APPLICATIONS

This application is a divisional of U.S. patent application Ser. No. 13/834,906, filed Mar. 15, 2013, which claims the benefit of Japanese Patent Application Nos. 2012-134083, filed Jun. 13, 2012 and 2013-010461, filed Jan. 23, 2013, which are incorporated herein by reference.

BACKGROUND OF THE INVENTION

1. Field of the Invention

The present invention relates to a substrate processing apparatus and a substrate processing method which process a substrate. Examples of the substrate to be processed include semiconductor wafers, substrates for liquid crystal display devices, substrates for plasma display devices, substrates for FED (Field Emission Display) devices, substrates for optical disks, substrates for magnetic disks, substrates for magneto-optical disks and substrates for photo masks.

2. Description of Related Art

In a manufacturing process for a semiconductor device or a liquid crystal display, etc., a cleaning process of removing particles and other foreign matter from a substrate, such as a semiconductor wafer or a liquid crystal display glass substrate, etc., is performed. The cleaning process is performed, for example, by spray cleaning, in which a large number of liquid droplets are collided against the substrate, or by ultrasonic cleaning, in which ultrasonic waves are applied to a processing liquid on a substrate. U.S. Patent Application Publication No. 2006/266382 A1 discloses a cleaning method in which an aqueous film covering a front surface of a substrate is expanded by freezing and adhesion of particles with respect to the substrate is weakened thereby.

In a cleaning process, it is required that particles be removed from the substrate while preventing collapsing of patterns formed on the substrate. However, as patterns are being made finer and finer, the patterns are lowered in strength and therefore with the spray cleaning and ultrasonic cleaning, the patterns may collapse. Although a method with which momenta of the liquid droplets collided against the substrate or the ultrasonic waves are weakened may be considered, an adequate cleaning effect cannot be obtained with this method. Also with the cleaning method according to U.S. Patent Application Publication No. 2006/266382 A1, a processing time is increased because the aqueous film covering the front surface of the substrate must be frozen and the frozen aqueous film must be thawed and removed from the substrate.

SUMMARY OF THE INVENTION

Collapsing of a pattern occurs when a force (a difference of two forces in a case where forces act on opposite sides of a pattern) in a collapsing direction (a direction parallel to a front surface of the substrate) acting on a pattern exceeds a strength of the pattern. Also, when a force is applied to a tip portion of a pattern, a force acting on a base of the pattern is amplified by the principle of leverage and the pattern may thus collapse even if the force is small.

Therefore in regard to a method of removing particles while suppressing or preventing collapsing of a pattern, (1) preventing a force in the collapsing direction from acting on the pattern, (2) restricting a portion on which a force in the collapsing direction acts to just a vicinity of a base of the pattern, and (3) making two forces of opposite directions and equal magnitude act on opposite sides of the pattern in a case where a force in the collapsing direction acts on a tip portion of the pattern may be considered.

An object of the present invention is to provide a substrate processing apparatus and a substrate processing method by which particles can be removed from a substrate while suppressing or preventing collapsing of a pattern.

A preferred embodiment of the present invention provides a substrate processing apparatus including a substrate holding unit which holds a substrate, a cleaning liquid supplying unit which supplies, to the substrate held by the substrate holding unit, a cleaning liquid containing a foaming agent that foams due to application of foaming energy, and a foaming energy supplying unit which applies the foaming energy to the cleaning liquid in contact with the substrate held by the substrate holding unit.

With this arrangement, the foaming energy is applied to the cleaning liquid in a state where the cleaning liquid is in contact with the substrate. The foaming agent thus foams and bubbles form in the cleaning liquid. Particles adhered to the substrate are pushed in directions of separating from the substrate by the bubbles interposed between the substrate and the particles. Adhesion of the particles to the substrate is thus weakened and the particles are flaked off from the substrate. Further, in a case where a pattern is formed on the substrate, bubbles form at opposite sides of the pattern and therefore two forces of opposite directions and equal magnitude are applied to the pattern. The forces applied to the pattern thus cancel each other out. The particles can thus be removed while suppressing or preventing collapsing of the pattern.

In the preferred embodiment of the present invention, the foaming energy supplying unit may apply the foaming energy to the substrate held by the substrate holding unit to make the foaming energy be transmitted from the substrate to the cleaning liquid.

With this arrangement, the foaming energy generated by the foaming energy supplying unit is transmitted from the substrate to the cleaning liquid. The foaming of the foaming agent thus begins at a position of contact of the substrate and the cleaning liquid (for example, a vicinity of a base of the pattern). Application of a force in a collapsing direction to a tip portion of the pattern can thus be suppressed or prevented. Collapsing of the pattern can thereby be suppressed or prevented. Further, even if a bubble layer containing a large number of bubbles spreads from the position of contact of the substrate and the cleaning liquid to the tip portion of the pattern, two forces of opposite directions and equal magnitude are applied to the pattern from the bubbles and the collapsing of the pattern can thus be suppressed or prevented.

In the preferred embodiment of the present invention, the substrate processing apparatus may further include an energy supply amount controller which controls an amount of the foaming energy applied to the cleaning liquid by controlling the foaming energy supplying unit.

With this arrangement, a duration of supplying of the foaming energy to the cleaning liquid and a strength (temperature, frequency, etc.) of the foaming energy generated by the foaming energy supplying unit are changed by the energy supply amount controller. The amount of the foaming energy applied to the cleaning liquid is thereby controlled. An amount of the bubbles formed in the cleaning liquid increases with an increase of the supplied amount of the foaming energy. The energy supply amount controller can thus restrict a region in which a bubble layer is formed to just a region in a vicinity of a front surface of the substrate (for example, a region of several nm to 100 nm from the front surface of the substrate) to restrict a region in which a physical force (a physical force applied to the pattern) is generated to just the vicinity of the front surface of the substrate. That is, the energy supply amount controller can suppress or prevent the pressing of the tip portion of the pattern by the bubbles. On the other hand, in the conventional spray cleaning, liquid droplets with a diameter of several μm to several dozen μm collide against the substrate and the region in which the physical force acts cannot be restricted to just the vicinity of the front surface of the substrate. Also, with ultrasonic cleaning, the position at which cavitation occurs cannot be controlled and physical forces are generated at various locations in the cleaning liquid. The energy supply amount controller can thus suppress or prevent the collapsing of the pattern by controlling the amount of foaming energy applied to the cleaning liquid.

In the preferred embodiment of the present invention, the cleaning liquid supplying unit may supply, to the substrate held by the substrate holding unit, the cleaning liquid containing the foaming agent that foams due to application of the foaming energy, a solvent that evaporates due to application of the foaming energy, and a solute that solidifies due to evaporation of the solvent.

With this arrangement, when the foaming energy is applied to the cleaning liquid, the foaming agent foams and the solvent of the cleaning liquid evaporates. The solute of the cleaning liquid solidifies as the solvent evaporates. The solute thus solidifies in a state of containing the bubbles formed by the foaming of the foaming agent. A state in which bubbles are interposed between particles and the substrate is thus maintained. In other words, a state in which forces in directions of separating from the substrate are applied to the particles is maintained. The particles flaked off from the substrate can therebybe suppressed or prevented from readhering to the substrate.

In the preferred embodiment of the present invention, the substrate processing apparatus may further include a dissolving liquid supplying unit which supplies a dissolving liquid that dissolves the solute of the cleaning liquid to the substrate held by the substrate holding unit, and a controller which controls the cleaning liquid supplying unit, the foaming energy supplying unit, and the dissolving liquid supplying unit.

In this case, the controller may execute a cleaning liquid supplying step of causing the cleaning liquid supplying unit to supply the cleaning liquid to the substrate, a foaming energy supplying step of causing the foaming energy supplying unit to apply the foaming energy from the foaming energy supplying unit to the cleaning liquid in contact with the substrate, and a dissolving liquid supplying step of causing the dissolving liquid supplying unit to supply the dissolving liquid to the substrate after the cleaning liquid supplying step and the foaming energy supplying step.

With this arrangement, the cleaning liquid, containing the foaming agent, the solvent, and the solute, is supplied to the substrate and the foaming energy is supplied to the cleaning liquid. Thereafter, the dissolving liquid that dissolves the solute of the cleaning liquid is supplied to the substrate. As described above, when the foaming energy is applied to the cleaning liquid, the foaming agent foams and the solvent of the cleaning liquid evaporates. The solute of the cleaning liquid solidifies as the solvent evaporates. The solute thus solidifies in the state of containing the bubbles formed by the foaming of the foaming agent. The solidified solute then dissolves in the dissolving liquid supplied to the substrate. The solute can thereby be removed from the substrate.

In the preferred embodiment of the present invention, the foaming energy supplying unit may start the generation of the foaming energy after the cleaning liquid is supplied to the substrate held by the substrate holding unit or before the cleaning liquid is supplied to the substrate held by the substrate holding unit.

In the preferred embodiment of the present invention, the foaming energy supplying unit may include at least one of a heat generating unit which generates heat that is transmitted to the cleaning liquid, a vibrating unit which generates vibration that is transmitted to the cleaning liquid, a gas pressure changing unit which changes a gas pressure of a space in which the substrate held by the substrate holding unit is disposed, and a light irradiating unit which irradiates light toward the substrate held by the substrate holding unit.

Another preferred embodiment of the present invention provides a substrate processing method including a cleaning liquid supplying step of supplying a cleaning liquid, containing a foaming agent that foams due to application of foaming energy, to a substrate and a foaming energy supplying step of applying the foaming energy to the cleaning liquid in contact with the substrate. With this method, the same effects as the effects described above can be exhibited.

In the other preferred embodiment of the present invention, the foaming energy supplying step may include a step of applying the foaming energy to the substrate to make the foaming energy be transmitted from the substrate to the cleaning liquid. With this method, the same effects as the effects described above can be exhibited.

In the other preferred embodiment of the present invention, the foaming energy supplying step may include an energy supply amount controlling step of controlling an amount of the foaming energy applied to the cleaning liquid. With this method, the same effects as the effects described above can be exhibited.

In the other preferred embodiment of the present invention, the cleaning liquid supplied to the substrate in the cleaning liquid supplying step may contain the foaming agent that foams due to application of the foaming energy, a solvent that evaporates due to application of the foaming energy, and a solute that solidifies due to evaporation of the solvent. With this method, the same effects as the effects described above can be exhibited.

In the other preferred embodiment of the present invention, the substrate processing method may further include a dissolving liquid supplying step of supplying a dissolving liquid, dissolving the solute of the cleaning liquid, to the substrate after the cleaning liquid supplying step and the foaming energy supplying step. With this method, the same effects as the effects described above can be exhibited.

In the other preferred embodiment of the present invention, the foaming energy supplying step may be a step of supplying the foaming energy to the cleaning liquid by means of at least one of a heat generating unit which generates heat that is transmitted to the cleaning liquid, a vibrating unit which generates vibration that is transmitted to the cleaning liquid, a gas pressure changing unit which changes a gas pressure of a space in which the substrate is disposed, and a light irradiating unit which irradiates light toward the substrate. With this method, the same effects as the effects described above can be exhibited.

The above and yet other objects, features, and effects of the present invention shall be made clear by the following description of preferred embodiments in reference to the attached drawings.

BRIEF DESCRIPTION OF THE DRAWINGS

FIG. 4 is a flowchart for describing an example of processing of a substrate performed by the substrate processing apparatus.

DETAILED DESCRIPTION OF PREFERRED EMBODIMENTS

Figure 1:
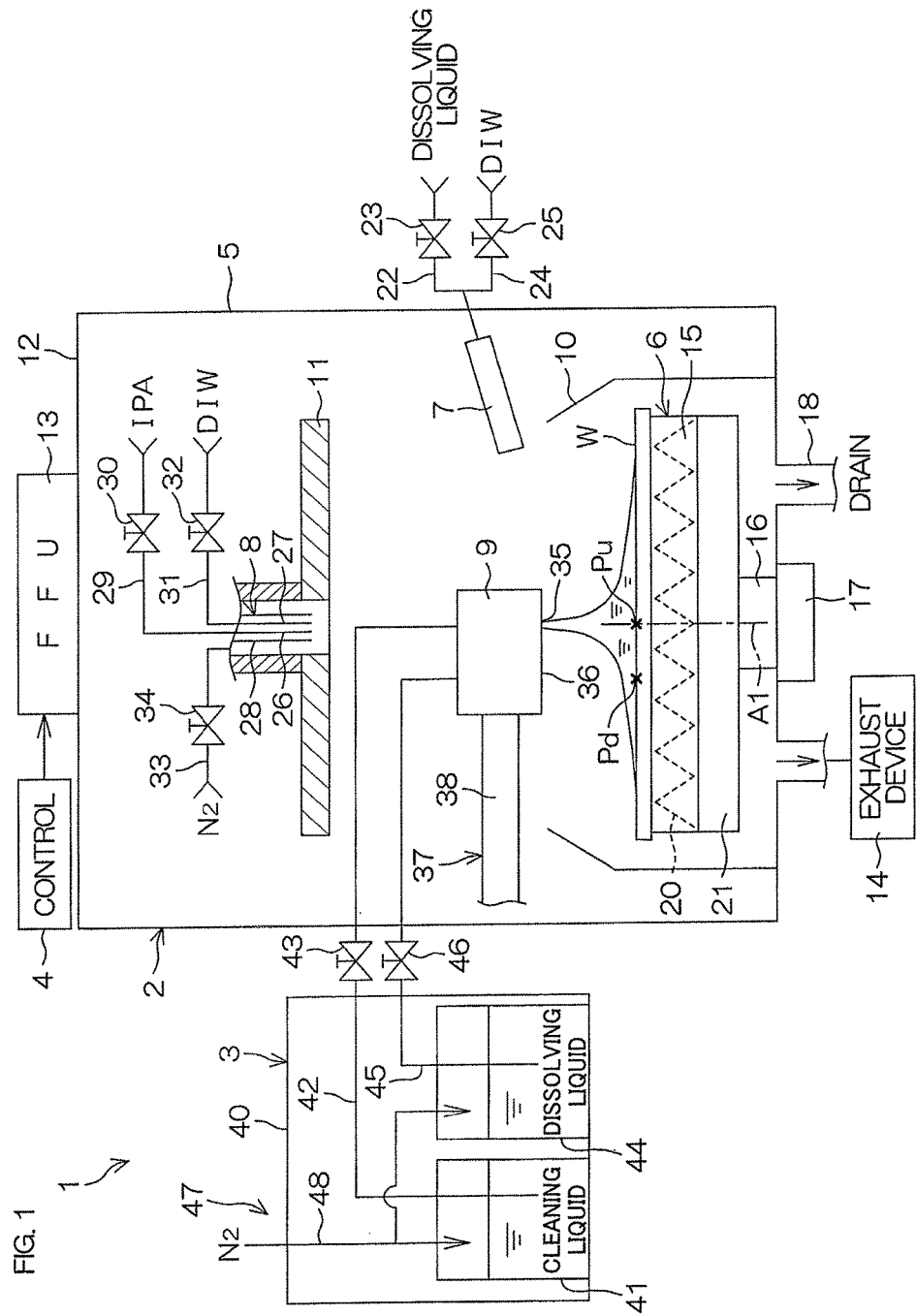
FIG. 1 is a schematic view as seen horizontally of an interior of a processing unit provided in a substrate processing apparatus according to a preferred embodiment of the present invention.
Figure 2:
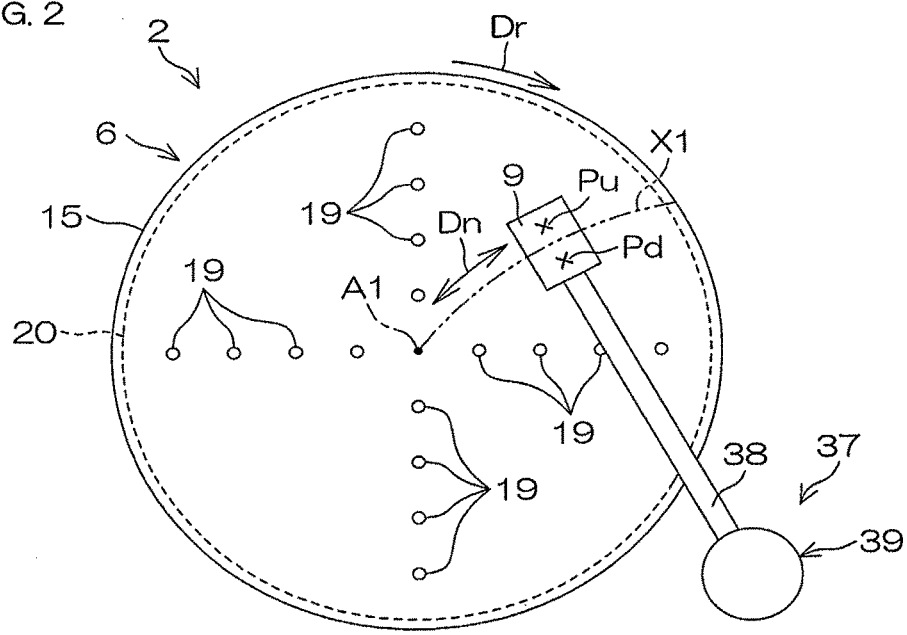
FIG. 2 is a schematic view of the interior of the processing unit as seen from above.
Figure 3:
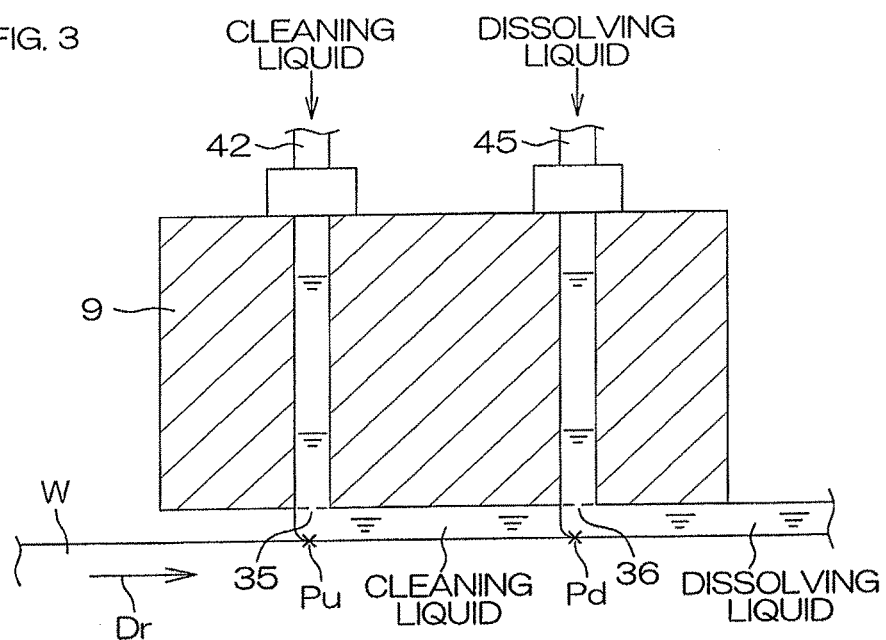
FIG. 3 is a schematic sectional view of a scan nozzle (cleaning liquid nozzle).

FIG. 1 is a schematic view as seen horizontally of an interior of a processing unit 2 provided in a substrate processing apparatus 1 according to a preferred embodiment of the present invention. FIG. 2 is a schematic view of the interior of the processing unit 2 as seen from above. FIG. 3 is a schematic sectional view of a scan nozzle 9.

As shown in FIG. 1, the substrate processing apparatus 1 is a single substrate processing type apparatus that processes a disk-shaped substrate W, such as a semiconductor wafer, etc., one by one. The substrate processing apparatus 1 includes a processing unit 2 processing a substrate W using processing liquids, such as a cleaning liquid, a dissolving liquid, etc., a cleaning liquid unit 3 supplying the cleaning liquid and the dissolving liquid to the processing unit 2, and a controller 4 controlling operations of devices and opening and closing of valves provided in the substrate processing apparatus 1.

As shown in FIG. 1, the processing unit 2 includes a box-shaped chamber, a spin chuck 6 holding the substrate W horizontally inside the chamber 5 and rotating the substrate W around a vertical substrate rotation axis A1 passing through a central portion of the substrate W, a plurality of nozzles (a fixed nozzle 7, a central axis nozzle 8, and the scan nozzle 9) discharging processing liquids toward the substrate W held by the spin chuck 6, and a cylindrical cup 10 surrounding a periphery of the spin chuck 6. Further, the processing unit 2 includes a disk-shaped shield plate 11 held horizontally above the spin chuck 6 and a shield plate raising/lowering unit (not shown) that raises and lowers the shield plate 11 above the substrate W. The shield plate raising/lowering unit raises and lowers the shield plate 11 between a proximal position at which a lower surface of the shield plate 11 is set at a height close to an upper surface of the substrate W such that the plurality of nozzles cannot enter between the substrate W and the shield plate 11 and a retracted position (position shown in FIG. 1) higher than the proximal position.

As shown in FIG. 1, the chamber 5 includes a box-shaped partition wall 12, an FFU 13 (fan filter unit 13) as an air blowing unit that feeds clean air into an interior of the partition wall 12 (corresponding to an interior of the chamber 5) from an upper portion of the partition wall 12, and an exhaust device 14 that discharges a gas inside the chamber 5 from a lower portion of the partition wall 12. The spin chuck 6, the plurality of nozzles, the cup 10, and the shield plate 11 are disposed inside the partition wall 12. The FFU 13 is disposed above the partition wall 12 and is mounted on a ceiling of the partition wall 12. The FFU 13 feeds clean air into the chamber 5 from the ceiling of the partition wall 12. The exhaust device 14 is connected to a bottom portion of the cup 10 and sucks the gas inside the chamber 5 from the bottom portion of the cup 10. The FFU 13 and the exhaust device 14 form a down flow inside the chamber 5. The processing of the substrate W is performed in a state where the down flow is formed inside the chamber 5. Further, a gas pressure inside the chamber 5 is maintained at a fixed pressure within a range from a negative pressure (a pressure lower than an atmospheric pressure) to a positive pressure (a pressure higher than the atmospheric pressure) by a blowing flow rate of the FFU 13 and a venting flow rate of the exhaust device 14 being controlled by the controller 14.

As shown in FIG. 1, the spin chuck 6 includes a disk-shaped spin base 15 holding the substrate W horizontally, a rotating shaft 16 extending downward from the spin base 15, and a spin motor 17 rotating the substrate W and the spin base 15 around the substrate rotation axis A1. The controller 4 controls the spin motor 17 to rotate the substrate W, held by the spin base 15, in a fixed rotation direction Dr (clockwise in FIG. 2). The spin base 15 is kept in a horizontal attitude. The spin base 15 has a diameter that is slightly smaller than that of the substrate W (for example, a diameter approximately 3 mm smaller than the diameter of the substrate W). The substrate W is held on the spin base 15 so that a center of the substrate W is positioned on a central axis of the spin base 15. The cup 10 surrounds the spin base 15. The cup 10 has an inner diameter that is greater than the outer diameter of the spin base 15. An opening portion of the cup 10 that is opened upward is disposed higher than the spin base 15. A processing liquid discharged to a periphery of the substrate W is thus received by the cup 10. The processing liquid that is guided to the bottom portion of the cup 10 is discharged from the cup 10 through a drain piping 18 connected to the bottom portion of the cup 10 and then recovered or discarded.

The spin chuck 6 may be a clamping type chuck that holds the substrate W horizontally by clamping the substrate W in a horizontal direction or may be a vacuum type chuck that holds the substrate W horizontally by suctioning of a rear surface (lower surface) of the substrate W that is a non-device-forming surface. A case where the spin chuck 6 is a vacuum type chuck is shown in FIG. 1 and FIG. 2. As shown in FIG. 2, the spin base 15 includes a plurality of suction holes 19 that open at an upper surface of the spin base 15. The plurality of suction holes 19 are disposed at positions facing a central portion of the substrate W, an intermediate portion of the substrate W that surrounds the central portion, and a peripheral edge portion of the substrate W that surrounds the intermediate portion. In FIG. 2, the plurality of suction holes 19 are disposed on cross lines intersecting perpendicularly at a center of the spin base 15. The plurality of suction holes 19 are connected to an unillustrated suction device. When suction is drawn at the plurality of suction holes 19 in a state where the substrate W is disposed on the spin base 15, a plurality of portions of the substrate W are suctioned toward the plurality of suction holes 19. The substrate W is thereby held horizontally on the spin base 15 with the lower surface of the substrate W and the upper surface of the spin base 15 being in contact.

As shown in FIG. 1, the processing unit 2 includes a heater 20 as a heating element that generates heat to heat the processing liquid on the substrate W and an ultrasonic transducer 21 that generates vibration (ultrasonic waves) to apply the vibration to the processing liquid on the substrate W. The heater 20 is built into the spin base 15 and the ultrasonic transducer 21 is held below the spin base 15 by the spin base 15. The heater 20 is formed to a disk shape having an outer diameter slightly smaller than that of the spin base 15. The ultrasonic transducer 21 is formed to a disk shape having an outer diameter equal to that of the spin base 15. The spin base 15 and the ultrasonic transducer 21 are disposed coaxially and overlap with each other in a plan view. The heater 20 and the ultrasonic transducer 21 rotate together with the spin base 15 around the substrate rotation axis A1. The heater 20 and the ultrasonic transducer 21 may be rotatable relative to the spin base 15.

A temperature of the heater 20 is controlled by the controller 4. The entire upper surface of the spin base 15 is heated uniformly from below by the heater 20. The entire substrate W is thus heated uniformly from below by the heater 20. Therefore, when the substrate W is heated in a state where the processing liquid is retained on the substrate W, the processing liquid on the substrate W is heated uniformly from below by the heater 20. Also, a frequency and an amplitude of the vibration generated by the ultrasonic transducer 21 are controlled by the controller 4. The vibration from the ultrasonic transducer 21 is transmitted uniformly across the entire substrate W via the spin base 15. Therefore, when the ultrasonic transducer 21 generates the vibration in the state where the processing liquid is retained on the substrate W, the vibration from the ultrasonic transducer 21 is transmitted uniformly from below to the processing liquid on the substrate W.

As shown in FIG. 1, the plurality of processing liquid nozzles include the fixed nozzle 7 as a rinse liquid nozzle that discharges, in a fixed state, a processing liquid toward a central portion of the upper surface of the substrate W. The processing unit 2 includes a first dissolving liquid piping 22 connected to the fixed nozzle 7 and a first dissolving liquid valve 23 interposed in the first dissolving liquid piping 22. The processing unit 2 further includes a first rinse liquid piping 24 connected to the fixed nozzle 7 and a first rinse liquid valve 25 interposed in the first rinse liquid piping 24. The first dissolving liquid piping 22 is connected to a dissolving liquid unit (not shown) that supplies the dissolving liquid as a rinse liquid and the first rinse liquid piping 24 is connected to a rinse liquid supply source. The dissolving liquid inside the dissolving liquid unit is a liquid of the same type as a solvent of the cleaning liquid to be described below and is a liquid that dissolves the solute of the cleaning liquid. The dissolving liquid may be liquid of a different type from the solvent of the cleaning liquid, as long as it is a liquid that dissolves the solute of the cleaning liquid.

When the first dissolving liquid valve 23 is opened, the dissolving liquid from the dissolving liquid unit is supplied from the first dissolving liquid piping 22 to the fixed nozzle 7 and is discharged toward the central portion of the upper surface of the substrate W from the fixed nozzle 7. Similarly, when the first rinse liquid valve 25 is opened, the rinse liquid from the rinse liquid supply source is supplied from the first rinse liquid piping 24 to the fixed nozzle 7 and is discharged toward the central portion of the upper surface of the substrate W from the fixed nozzle 7. The rinse liquid supplied to the fixed nozzle 7 may be pure water (deionized water), carbonated water, electrolyzed ion water, hydrogen water, ozone water, or aqueous hydrochloric acid of dilute concentration (for example, approximately 10 to 100 ppm), etc.

As shown in FIG. 1, the plurality of nozzles include the central axis nozzle 8 as a rinse liquid nozzle extending in an up/down direction along a central axis of the shield plate 11. The shield plate 11 is held horizontally above the spin chuck 6 in a manner such that the central axis of the shield plate 11 is positioned on the substrate rotation axis A1. The shield plate 11 has a larger outer diameter than that of the substrate W. The lower surface of the shield plate 11 thus faces the entire upper surface of the substrate W. The central axis nozzle 8 is inserted in a penetrating hole that penetrates through a central portion of the shield plate 11 in the up/down direction. A lower end portion of the central axis nozzle 8 is disposed higher than the lower surface of the shield plate 11. The central axis nozzle 8 is raised and lowered together with the shield plate 11.

As shown in FIG. 1, the central axis nozzle 8 includes a plurality of inner tubes (a dissolving agent tube 26 and a rinse liquid tube 27) extending in the up/down direction along the substrate rotation axis A1 and a cylindrical casing 28 surrounding the plurality of inner tubes. The plurality of inner tubes include the dissolving agent tube 26 that discharges a dissolving agent toward the central portion of the upper surface of the substrate W and the rinse liquid tube 27 that discharges the rinse liquid toward the central portion of the upper surface of the substrate W. The casing 28 extends in the up/down direction along the substrate rotation axis A1. The casing 28 is inserted in a non-contacting state inside the penetrating hole that penetrates through the central portion of the shield plate 11 in the up/down direction. An inner peripheral surface of the shield plate 11 thus surrounds an outer peripheral surface of the casing 28 across a radial interval.

As shown in FIG. 1, the processing unit 2 includes a second dissolving liquid piping 29 connected to the dissolving agent tube 2, a second dissolving liquid valve 30 interposed in the second dissolving liquid piping 29, a second rinse liquid piping 31 connected to the rinse liquid tube 27, and a second rinse liquid valve 32 interposed in the second rinse liquid piping 31. When the second dissolving liquid valve 30 is opened, the dissolving agent is discharged toward the central portion of the upper surface of the substrate W from the central axis nozzle 8 (a lower end portion of the dissolving agent tube 26). Similarly, when the second rinse liquid valve 32 is opened, the dissolving agent is discharged toward the central portion of the upper surface of the substrate W from the central axis nozzle 8 (a lower end portion of the rinse liquid tube 27). The dissolving agent supplied to the central axis nozzle 8 is a volatile organic solvent (liquid) that is higher in volatility than pure water and is lower in surface tension than pure water. Although in the present preferred embodiment, the volatile organic solvent is IPA (isopropyl alcohol), the dissolving agent may be HFE (hydrofluoroether) or other volatile organic solvent or a mixed liquid thereof.

As shown in FIG. 1, the processing unit 2 further includes a gas piping 33 supplying an inert gas into the cylindrical space between the outer peripheral surface of the casing 28 and the inner peripheral surface of the shield plate 11 and a gas valve 34 interposed in the gas piping 33. When the gas valve 34 is opened, the inert gas from a gas supply source passes the space between the outer peripheral surface of the casing 28 and the inner peripheral surface of the shield plate 11 and is discharged downward from a central portion of the lower surface of the shield plate 11. Therefore, when the gas valve 34 is opened in a state where the shield plate 11 is disposed at the proximal position, the inert gas discharged from the central portion of the lower surface of the shield plate 11 spreads outward (in directions of separating from the substrate rotation axis A1) between the substrate W and the shield plate 11 and air of the substrate W and the shield plate 11 is replaced by the inert gas. The inert gas flowing through the gas piping 33 is nitrogen gas. The inert gas is not restricted to nitrogen gas and may be another inert gas, such as helium gas or argon gas, etc.

As shown in FIG. 1, the plurality of nozzles include the scan nozzle 9 that discharges processing liquids while moving above the substrate W in a manner such that landing positions of the processing liquids move within the upper surface of the substrate W. The scan nozzle 9 as a cleaning liquid nozzle is connected to the cleaning liquid unit 3. As shown in FIG. 3, the scan nozzle 9 includes a cleaning liquid discharge port 35 facing the upper surface of the substrate W and a dissolving liquid discharge port 36 facing the upper surface of the substrate W. The cleaning liquid discharge port 35 and the dissolving liquid discharge port 36 open at a lower surface of the scan nozzle 9. The cleaning liquid inside the cleaning liquid unit 3 is discharged downward from the cleaning liquid discharge port 35 toward an upstream position Pu within the upper surface of the substrate W and the dissolving liquid inside the cleaning liquid unit 3 is discharged from the dissolving liquid discharge port 36 toward a downstream position Pd within the upper surface of the substrate W. As shown in FIG. 2, the upstream position Pu is a position upstream than the downstream position Pd in the rotation direction Dr of the substrate W. The upstream position Pu and the downstream position Pd are aligned along the rotation direction Dr of the substrate W. Therefore, in a state where the cleaning liquid and the dissolving liquid are discharged respectively from the cleaning liquid discharge port 35 and the dissolving liquid discharge port 36, the cleaning liquid supplied to the substrate W is immediately rinsed off by the dissolving liquid discharged from the dissolving liquid discharge port 36.

As shown in FIG. 2, the processing unit 2 includes a nozzle moving mechanism 37 that moves the scan nozzle 9 in a nozzle moving direction Dn that intersects the substrate rotation axis A1. The nozzle moving mechanism 37 includes a nozzle arm 38 holding the scan nozzle 9 and a driving mechanism 39 rotating the nozzle arm 38 around a nozzle rotation axis extending vertically at a periphery of the spin chuck 6. The driving mechanism 39 may be of an arrangement including a vertical support shaft coupled to the nozzle arm 38 and a motor coaxial to the support shaft or may be of an arrangement including a vertical support shaft coupled to the nozzle arm 38, a motor generating power that rotates the support shaft around its central axis, and an endless annular transmitting member (for example, a belt) coupling the support shaft and the motor.

As shown in FIG. 2, the nozzle moving mechanism 37 moves the scan nozzle 9 horizontally along a locus X1 passing through the central portion of the upper surface of the substrate W in a plan view. In a plan view, the locus X1 is an arcuate curve passing through the central portion of the upper surface of the substrate W. The locus X1 may instead be a rectilinear line passing through the central portion of the upper surface of the substrate W in a plan view. The nozzle moving direction Dn is a horizontal direction along the locus X1. The nozzle moving mechanism 37 moves the scan nozzle 9 horizontally along the locus X1 between a processing region (position shown in FIG. 2) in which the scan nozzle 9 is positioned above the substrate W and a retracted position at which the scan nozzle 9 is separated from the region above the substrate W.

When the substrate W is to be processed by a processing liquid, the controller 4 rotates the substrate W around the substrate rotation axis A1 by means of the spin chuck 6. In this state, the controller 4 makes the processing liquid (at least one of either of the cleaning liquid and the dissolving liquid) be discharged toward the upper surface of the substrate W from the scan nozzle 9. Further, the controller 4 controls the nozzle moving mechanism 37 to move the scan nozzle 9 horizontally between a center position at which the processing liquid discharged from the scan nozzle 9 lands at the central portion of the upper surface of the substrate W and an edge position at which the processing liquid discharged from the scan nozzle 9 lands at a peripheral edge portion of the upper surface of the substrate W. The upstream position Pu at which the cleaning liquid discharged from the cleaning liquid discharge port 35 lands is thereby scanned across the entire upper surface of the substrate W and the cleaning liquid is supplied to the entire upper surface of the substrate W. Similarly, the downstream position Pd at which the dissolving liquid discharged from the dissolving liquid discharge port 36 lands is scanned across the entire upper surface of the substrate W and the dissolving liquid is supplied to the entire upper surface of the substrate W.

As shown in FIG. 1, the cleaning liquid unit 3 includes a box-shaped housing 40, a cleaning liquid tank 41 disposed inside the housing 40, a cleaning liquid piping 42 connecting the cleaning liquid tank 41 and the scan nozzle 9 (cleaning liquid discharge port 35), and a cleaning liquid valve 43 interposed in the cleaning liquid piping 42. Further, the cleaning liquid unit 3 includes a dissolving liquid tank 44 disposed inside the housing 40, a third dissolving liquid piping 45 connecting the dissolving liquid tank 44 and the scan nozzle 9 (dissolving liquid discharge port 36), a third dissolving liquid valve 46 interposed in the third dissolving liquid piping 45, and a liquid supplying unit 47 feeding the cleaning liquid inside the cleaning liquid tank 41 and the dissolving liquid inside the dissolving liquid tank 44 to the scan nozzle 9.

The liquid supplying unit 47 may be a gas supplying unit that raises a gas pressure inside a tank to feed a processing liquid inside the tank to a piping or may be a pump interposed in a piping that guides a processing liquid from a tank to the scan nozzle 9. In FIG. 1, a case where the liquid supplying unit 47 is a gas pressure supplying unit is illustrated. The liquid supplying unit 47 shown in FIG. 1 includes a pressurizing piping 48 that supplies an inert gas (nitrogen gas in FIG. 1) from an inert gas supply source into the cleaning liquid tank 41 and the dissolving liquid tank 44 to raise a gas pressure inside the cleaning liquid tank 41 and a gas pressure inside the dissolving liquid tank 44.

In a state where the cleaning liquid valve 43 is open and the third dissolving liquid valve 46 is closed, the cleaning liquid inside the cleaning liquid tank 41 is supplied to the scan nozzle 9 through the cleaning liquid piping 42 and is discharged downward toward the upstream position Pu within the upper surface of the substrate W from the cleaning liquid discharge port 35 provided in the scan nozzle 9. Oppositely, in a state where the cleaning liquid valve 43 is closed and the third dissolving liquid valve 46 is open, the dissolving liquid inside the dissolving liquid tank 44 is supplied to the scan nozzle 9 through the third dissolving liquid piping 45 and is discharged downward toward the downstream position Pd within the upper surface of the substrate W from the dissolving liquid discharge port 36 provided in the scan nozzle 9. Also, in a state where the cleaning liquid valve 43 and the third dissolving liquid valve 46 are open, the cleaning liquid and the dissolving liquid are discharged from the scan nozzle 9.

The cleaning liquid inside the cleaning liquid tank 41 is a solution in which the solute and a foaming agent are dissolved in the solvent. The dissolving liquid inside the dissolving liquid tank 44 is a liquid that dissolves the solute of the cleaning liquid. The dissolving liquid in the dissolving liquid tank 44 is the same type of liquid as the solvent of the cleaning liquid. The dissolving liquid in the dissolving liquid tank 44 may be a liquid of a different type from the solvent of the cleaning liquid.

The solvent of the cleaning liquid is a liquid that dissolves the solute and the solute of the cleaning liquid is a substance that changes from a liquid to a solid as a concentration of the solvent decreases. The foaming agent is a substance that foams due to application of a foaming energy, such as heat or vibration, etc. For example, when the cleaning liquid is heated, heat energy is applied to the foaming agent and bubbles form inside the cleaning liquid. Further, by heating of the cleaning liquid, the solvent of the cleaning liquid evaporates and the solute solidifies. A foam (a solid made up of the solute and containing bubbles) is thus formed in the cleaning liquid when the cleaning liquid is heated. Also, when vibration is applied to the cleaning liquid, bubbles form in the cleaning liquid and the solute solidifies in the same manner as in the case where the cleaning liquid is heated. The foam is thereby formed in the cleaning liquid.

A specific example of a combination of the solute, the solvent, and the foaming agent is polymethylmethacrylate resin (PMMA) as the solute, acrylic acid as the solvent, and baking powder (sodium bicarbonate) as the foaming agent.

Another specific example of the "foaming agent" is azodicarbonamide, which generates nitrogen gas due to application of the foaming energy. Yet other specific examples of the "foaming agent" include citric acid blend, dinitrosopentamethylenetetramine, sodium borohydride, p-toluenesulfonylhydrazide, 4,4'-oxobis(benzenesulfonylhydrazide), azodicarbonamide (1,1'-azobisformamide), p-toluenesulfonylsemicarbazide, 5-phenyltetrazole, and analogs of the above.

Another specific example of a combination of the solute and the solvent is an organic material (a material formed of an organic compound) as the solute and an organic solvent as the solvent. Specific examples of an organic material as the "solute" include polyolefins, polyethylene, polyethylene terephthalate, and polyethers, such as polyether ether ketone, etc. Other specific examples of an organic material as the "solute" include polystyrene, polyetherimides, polycarbonate, polymethylmethacrylate resins (PMMA), polyamide-based synthetic fibers, polysulfone, polycaprolactone, cellulose resins, acrylic resins, and aramids (aromatic polyamides). Specific examples of an organic solvent as the "solvent" include toluene, cyclopentanone, and cyclopentane. Other specific examples of an organic solvent as the "solvent" include alcohol organic solvents and ketone organic solvents.

In any combination, if the solute is water-soluble, pure water or other liquid having water as a main component may be used as the solvent. Also in any combination, an above-mentioned volatile organic solvent may be used as the solvent.

In a case where a front surface of the substrate W is a hydrophobic surface, the cleaning liquid may be repelled by the front surface of the substrate W and the front surface of the substrate W may become exposed partially. In such a case, a volatile organic solvent of low surface tension may be used to suppress or prevent the partial exposure of the front surface of the substrate W. Also, even in a case where a volatile organic solvent is not used as the solvent, as long as the cleaning liquid is high in viscosity, partial exposure of the front surface of the substrate W can be suppressed or prevented, even if the front surface of the substrate W is a hydrophobic surface. Therefore in a case where the front surface of the substrate W is a hydrophobic surface, concentrations of the respective components making up the cleaning liquid may be adjusted to adjust the viscosity of the cleaning liquid to a high viscosity. On the other hand, in a case where the front surface of the substrate W is a hydrophilic surface, the solvent may be a volatile organic solvent or may be a liquid other than a volatile organic solvent.

Figure 5A:
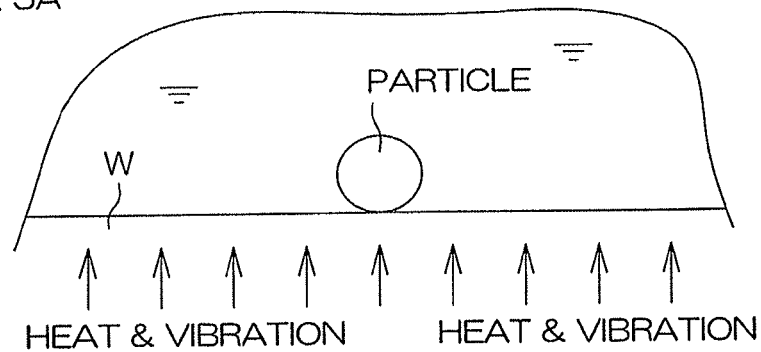
FIG. 5A is a schematic view for describing a state of a particle in a cleaning liquid.
Figure 5B:
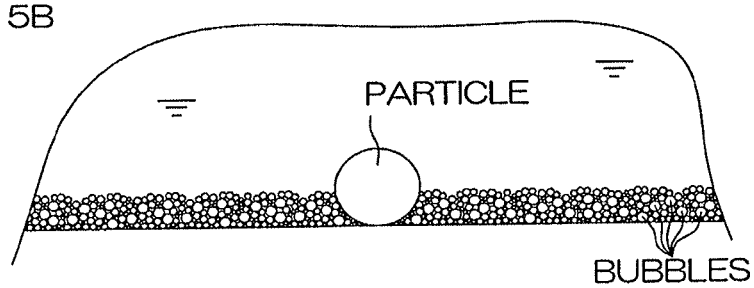
FIG. 5B is a schematic view for describing a state of the particle in the cleaning liquid.
Figure 5C:
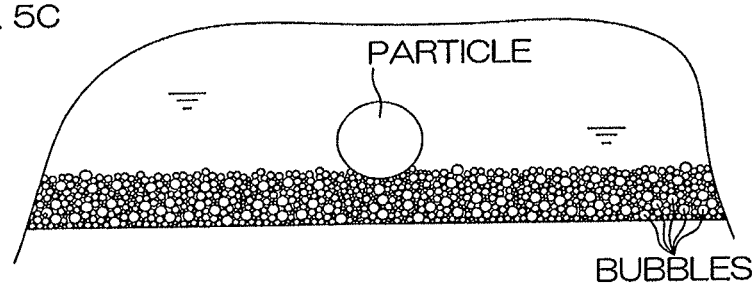
FIG. 5C is a schematic view for describing a state of the particle in the cleaning liquid.

FIG. 4 is a flowchart for describing an example of processing of the substrate W performed by the substrate processing apparatus 1. FIG. 5A to FIG. 5C are schematic views for describing states of a particle in the cleaning liquid. A processing example when the substrate W having a pattern formed thereon is processed in a state where a gas pressure inside the chamber 5 is maintained at atmospheric pressure shall be described. Also, FIG. 1 shall be referenced in the following description. FIG. 4, FIG. 5A, FIG. 5B, and FIG. 5C shall be referenced where appropriate.

When the substrate W is to be processed, a carrying-in step of carrying the substrate W onto the spin chuck 6 is performed (step S1 of FIG. 4). Specifically, in a state where the scan nozzle 9 and other arrangements inside the chamber 5 are retracted from above the spin chuck 6 and the shield plate 11 is positioned at the retracted position, the controller 4 controls an unillustrated transfer robot to place the substrate W, with the front surface faced upward, on the spin chuck 6 (spin base 15). Thereafter, the controller 4 controls the spin chuck 6 to make the spin base 15 suction the substrate 15. The substrate W is thereby held by the spin chuck 6. Thereafter, the controller 4 controls the spin chuck 6 to make the spin chuck 6 rotate the substrate W around the substrate rotation axis A1.

Thereafter, a heating step of heating the substrate W and a vibration applying step of applying vibration to the substrate W are performed in parallel (step S2 of FIG. 4). Specifically, the controller 4 controls the heater 20 built into the spin base 15 to make the heater 20 start generating heat. The entire substrate W held by the spin chuck 6 is thereby heated uniformly from below by the heater 20. Meanwhile, the controller 4 controls the ultrasonic transducer 21 to make the ultrasonic transducer 21 generate vibration. The vibration from the ultrasonic transducer 21 is thereby applied uniformly to the entire substrate W. The heat generation by heater 20 and the vibration from the ultrasonic transducer 21 may be started at the same time or may be started at different timings. Also, the heat generation by the heater 20 may be started before the substrate W is placed on the spin base 15 or may be started after the substrate W is placed on the spin base 15. The same applies to the starting of vibration from the ultrasonic transducer 21.

Thereafter, a cleaning liquid supplying step of supplying the cleaning liquid to the substrate W and a dissolving liquid supplying step of supplying the dissolving liquid to the substrate W are performed in parallel (step S3 of FIG. 4). Specifically, the controller 4 controls the nozzle moving mechanism 37 to move the scan nozzle 9 from the retracted position to above the substrate W. Thereafter, the controller 4 opens the cleaning liquid valve 43 to start the discharge of the cleaning liquid from the cleaning liquid discharge port 35 and opens the third dissolving liquid valve 46 to start the discharge of the dissolving liquid from the dissolving liquid discharge port 36. The cleaning liquid and the dissolving liquid are thereby discharged from the scan nozzle 9 toward the upper surface of the substrate W in the rotating state. The discharge of the dissolving liquid from the dissolving liquid discharge port 36 may be started at the same time as the discharge of the cleaning liquid from the cleaning liquid discharge port 35 or may be started before the discharge of the cleaning liquid from the cleaning liquid discharge port 35.

In the state where the cleaning liquid and the dissolving liquid are discharged from the scan nozzle 9 toward the upper surface of the substrate W in the rotating state, the controller 4 controls the nozzle moving mechanism 37 to reciprocate (half-scan) the scan nozzle 9 a plurality of times between the center position at which the cleaning liquid and the dissolving liquid land at the central portion of the upper surface of the substrate W and the edge position at which the cleaning liquid and the dissolving liquid land at the peripheral edge portion of the upper surface of the substrate W. The cleaning liquid and the dissolving liquid are thereby supplied to the entire upper surface of the substrate W. A liquid film of the cleaning liquid and the dissolving liquid that covers the entire upper surface of the substrate W is thereby formed. After elapse of a predetermined time from the start of discharge of the cleaning liquid and the dissolving liquid from the scan nozzle 9, the controller 4 closes the cleaning liquid valve 43 and the third dissolving liquid valve 46 to stop the discharge of the cleaning liquid and the dissolving liquid from the scan nozzle 9. Thereafter, the controller 4 controls the nozzle moving mechanism 37 to retract the scan nozzle 9 from above the substrate W. Further, the controller 4 controls the heater 20 and the ultrasonic transducer 21 to stop the heat generation and the vibration (step S4 of FIG. 4).

As shown in FIG. 5A, the cleaning liquid discharged from the cleaning liquid discharge port 35 is supplied to the entire upper surface of the substrate W in the state where the heat and the vibration are applied uniformly to the entire substrate W. The heat and vibration are thus applied to the cleaning liquid from the substrate W. The cleaning liquid contains the foaming agent that foams due to application of the foaming energy, such as the heat and the vibration, etc. The foaming agent in the cleaning liquid thus foams on the front surface of the substrate W at which the substrate W and the cleaning liquid are in contact, that is, on bottom surfaces of grooves formed by adjacent patterns and on front surfaces of the patterns per se and bubbles are formed in the cleaning liquid. A bubble layer (a liquid layer containing bubbles) is thus formed along the front surface of the substrate W as shown in FIG. 5B. Further, the solvent of the cleaning liquid evaporates due to the heating of the cleaning liquid and the solute thus solidifies in a state of containing the bubbles. The bubble layer containing the bubbles thus changes to a solid layer containing the bubbles (a layer made up of the foam).

The cleaning liquid interposed between a particle and the substrate W expands due to foaming of the foaming agent. The particle is thus pushed in a direction of separating from the substrate W by the volume expansion of the cleaning liquid. The particle is thereby raised (lifted up) by the bubble layer (the liquid layer containing the bubbles) as shown in FIG. 5C and the particle is flaked off from the substrate W. Further, the bubble layer changes to the solid layer containing the bubbles and the state where the bubbles are interposed between the particle and the substrate W is maintained. In other words, the state where forces in directions of separating from the substrate W are applied to the particle is maintained. The particle flaked off from the substrate W can thereby be suppressed or prevented from readhering to the substrate W.

Also, the bubbles that form due to the heating, etc., of the cleaning liquid expand isotropically inside the cleaning liquid. A force in a collapsing direction (direction parallel to the upper surface of the substrate W) may thus be applied to a pattern from the bubbles. However, the heat and the vibration are transmitted to the cleaning liquid from the substrate W and the bubble layer thus grows (the bubble layer increases in thickness) from a vicinity of a base of the pattern toward a tip portion of the pattern. The force in the collapsing direction is thus applied to the vicinity of the base of the pattern. Therefore, even if the force in the collapsing direction is applied to the pattern, collapsing of the pattern is unlikely to occur. Further, even if the bubble layer grows to the tip portion of the pattern, the bubbles format opposite sides of the pattern because the heat and vibration are applied uniformly to the entire substrate W. Two forces of opposite directions and equal magnitude are thus applied to the pattern and cancel each other out. Therefore even if the bubble layer grows to the tip portion of the pattern, collapsing of the pattern is unlikely to occur.

The solid layer containing the bubbles (the layer made up of the foam) is made up of the solute and dissolves in the solvent contained in the cleaning liquid. Similarly, the solid layer dissolves in the dissolving liquid discharged from the dissolving liquid discharge port 36. The solid layer on the substrate W is thus rinsed off from the substrate W together with the particles by the cleaning liquid and the dissolving liquid. The particles are thus removed from the entire upper surface of the substrate W. Moreover, the dissolving liquid discharged from the dissolving liquid discharge port 36 lands at the downstream position Pd that is further downstream than the upstream position Pu at which the cleaning liquid lands and is in the vicinity of the upstream position Pu, and therefore when the cleaning liquid lands on the substrate W, the dissolving liquid is supplied immediately to the landing position. The solid layer on the substrate W is thus rinsed off together with the particles from the substrate W immediately after it is formed. The solid layer on the substrate can thus be suppressed or prevented from growing to the tip portion of the pattern. Collapsing of the pattern is thereby suppressed or prevented.

Thereafter, a dissolving liquid supplying step (first rinse liquid supplying step) of supplying the dissolving liquid as a rinse liquid to the substrate W is performed (step S5 of FIG. 4). Specifically, the controller 4 opens the first dissolving liquid valve 23 to make the dissolving liquid be discharged from the fixed nozzle 7 toward the central portion of the upper surface of the substrate W in the rotating state. The dissolving liquid discharged from the fixed nozzle 7 lands on the central portion of the upper surface of the substrate W and thereafter flows outward on the substrate W due to a centrifugal force. The dissolving liquid that has reached the peripheral edge portion of the upper surface of the substrate W is then spun off to the periphery of the substrate W. The dissolving liquid is thereby supplied to the entire upper surface of the substrate W and the cleaning liquid and the dissolving liquid supplied to the substrate W from the scan nozzle 9 and the particles remaining on the substrate Ware rinsed off from the substrate W. The cleaning liquid and the dissolving liquid on the substrate W are thus replaced by the dissolving liquid discharged from the fixed nozzle 7 and a liquid film of the dissolving liquid that covers the entire upper surface of the substrate W is formed.

Thereafter, a rinse liquid supplying step (second rinse liquid supplying step) of supplying the rinse liquid to the substrate W (for example, pure water) is performed (step S6 of FIG. 4). Specifically, the controller 4 opens the first rinse liquid valve 25 to make the rinse liquid be discharged from the fixed nozzle 7 toward the central portion of the upper surface of the substrate W in the rotating state. The rinse liquid discharged from the fixed nozzle 7 lands on the central portion of the upper surface of the substrate Wand thereafter flows outward on the substrate W due to the centrifugal force. The rinse liquid that has reached the peripheral edge portion of the upper surface of the substrate W is then spun off to the periphery of the substrate W. The rinse liquid is thereby supplied to the entire upper surface of the substrate W and the dissolving liquid on the substrate W and the particles remaining on the substrate W are rinsed off from the substrate W. The dissolving liquid on the substrate W is thus replaced by the rinse liquid and a liquid film of the rinse liquid that covers the entire upper surface of the substrate W is formed.

Thereafter, a puddle step of retaining the liquid film of the rinse liquid on the substrate W in a state where the supplying of the rinse liquid to the substrate W is stopped is performed (step S7 of FIG. 4). Specifically, the controller 4 controls the spin chuck 6 to stop the rotation of the substrate W in the state where the entire upper surface of the substrate W is covered by the liquid film of the rinse liquid. Or, a rotation speed of the substrate W is decreased to a low rotation speed (for example, of 10 to 30 rpm) that is lower than the rotation speed in the rinse liquid supplying step. The centrifugal force acting on the rinse liquid on the substrate W is thus weakened and an amount of the rinse liquid discharged from the substrate W decreases. In the state where the substrate W is still or the substrate W is rotating at the low rotation speed, the controller 4 closes the first rinse liquid valve 25 to stop the discharge of the rinse liquid from the fixed nozzle 7. The liquid film of the rinse liquid that covers the entire upper surface of the substrate W is thereby retained on the substrate W in the state where the supplying of the rinse liquid to the substrate W is stopped.

Thereafter, an organic solvent supplying step of supplying a hydrophilic organic solvent (for example, IPA) of higher volatility than pure water to the substrate W is performed (step S8 of FIG. 4). Specifically, the controller 4 controls the spin chuck 6 to increase the rotation speed of the substrate W to higher than the rotation speed in the puddle step. Further, the controller 4 controls the shield plate raising/lowering unit to move the shield plate 11 from the retracted position to the proximal position. Further, the controller 4 opens the gas valve 34 to make nitrogen gas be discharged from the central portion of the lower surface of the shield plate 11. Thereafter, the controller 4 opens the second dissolving liquid valve 30 to make the organic solvent be discharged from the central axis nozzle 8 toward the central portion of the upper surface of the substrate W. The rinse liquid on the substrate W is thereby replaced by the organic solvent and a liquid film of the organic solvent that covers the entire upper surface of the substrate W is formed. After elapse of a predetermined time from the start of discharge of the organic solvent from the central axis nozzle 8, the controller 4 closes the second dissolving liquid valve 30 to stop the discharge of the organic solvent from the central axis nozzle 8 in the state where the discharge of nitrogen gas from the central portion of the lower surface of the shield plate 11 is continued.

Thereafter, a drying step (spin drying) of drying the substrate W is performed (step S9 of FIG. 4). Specifically, in the state where the shield plate 11 is disposed at the proximal position and the discharge of nitrogen gas from the central portion of the lower surface of the shield plate 11 is continued, the controller 4 controls the spin chuck 6 to increase the rotation speed of the substrate W to a high rotation speed (for example, of several thousand rpm) higher than the rotation speed in the steps from the carrying-in step to the organic solvent supplying step. The liquid on the substrate W is thereby spun off to the periphery of the substrate W and the substrate W dries in the state where an interval between the substrate W and the shield plate 11 is filled with nitrogen gas. After the high speed rotation of the substrate W is performed for a predetermined time, the controller 4 controls the spin chuck 6 to stop the rotation of the substrate W. Further, the controller 4 closes the gas valve 34 to stop the discharge of the nitrogen gas from the central portion of the lower surface of the shield plate 11. Further, the controller 4 controls the shield plate raising/lowering unit to raise the shield plate 11 to the retracted position. Thereafter, the controller 4 controls the transfer robot to make the transfer robot carry out the substrate W from the spin chuck 6 (carrying-out step).

As described above, with the present preferred embodiment, the foaming energy is applied to the cleaning liquid in the state where the cleaning liquid is in contact with the substrate W. The foaming agent added to the cleaning liquid thus foams and bubbles form in the cleaning liquid. The particles adhering to the substrate W are pushed in directions of separating from the substrate W by the bubbles interposed between the substrate W and the particles. Adhesion of the particles to the substrate W is thus weakened and the particles are flaked off from the substrate W. Moreover, when the foaming energy is applied to the cleaning liquid, the solvent of the cleaning liquid evaporates and the solute of the cleaning liquid solidifies so that the bubble layer (the liquid layer containing the bubbles) changes to a solid layer containing the bubbles. The state where the bubbles are interposed between the particle and the substrate W is thus maintained. The particles flaked off from the substrate W can thereby be suppressed or prevented from readhering to the substrate W. Further, the bubbles form at opposite sides of each pattern and two forces of opposite directions and equal magnitude are thus applied to the pattern. The forces applied to the pattern thus cancel each other out. The particles can thereby be removed while suppressing or preventing the collapsing of patterns.

Although a preferred embodiment of the present invention has been described above, the present invention is not restricted to the contents of the preferred embodiment and various modifications are possible within the scope of the claims.

For example, with the preferred embodiment, a case where the cleaning liquid and the dissolving liquid are discharged from a nozzle in common (scan nozzle 9) was described. That is, a case where the cleaning liquid nozzle that discharges the cleaning liquid and the dissolving liquid nozzle that discharges the dissolving liquid are integral was described. However, the cleaning liquid nozzle may be a separate nozzle from the dissolving liquid nozzle.

Also with the preferred embodiment, a case where the cleaning liquid nozzle is the scan nozzle 9 was described. However, the cleaning liquid nozzle may be a fixed nozzle or may be a central axis nozzle.

Figure 6:
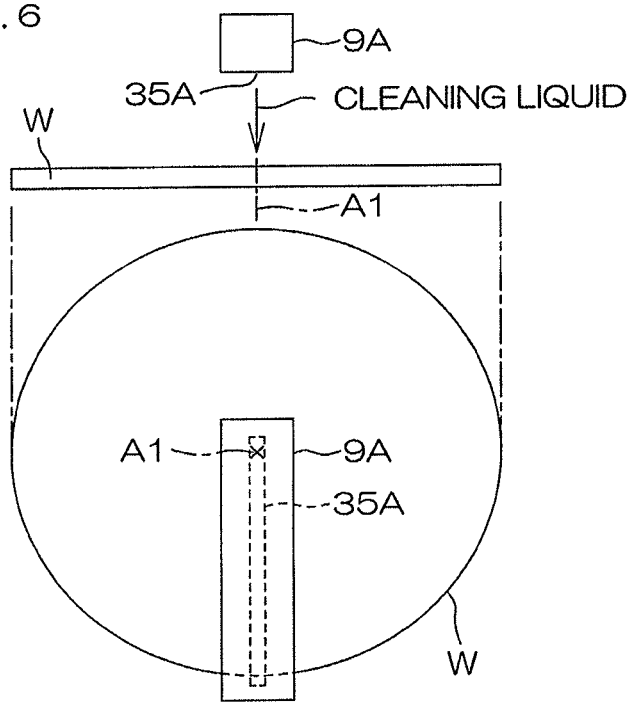
FIG. 6 is a schematic view of a cleaning liquid nozzle according to another preferred embodiment of the present invention.
Figure 7:
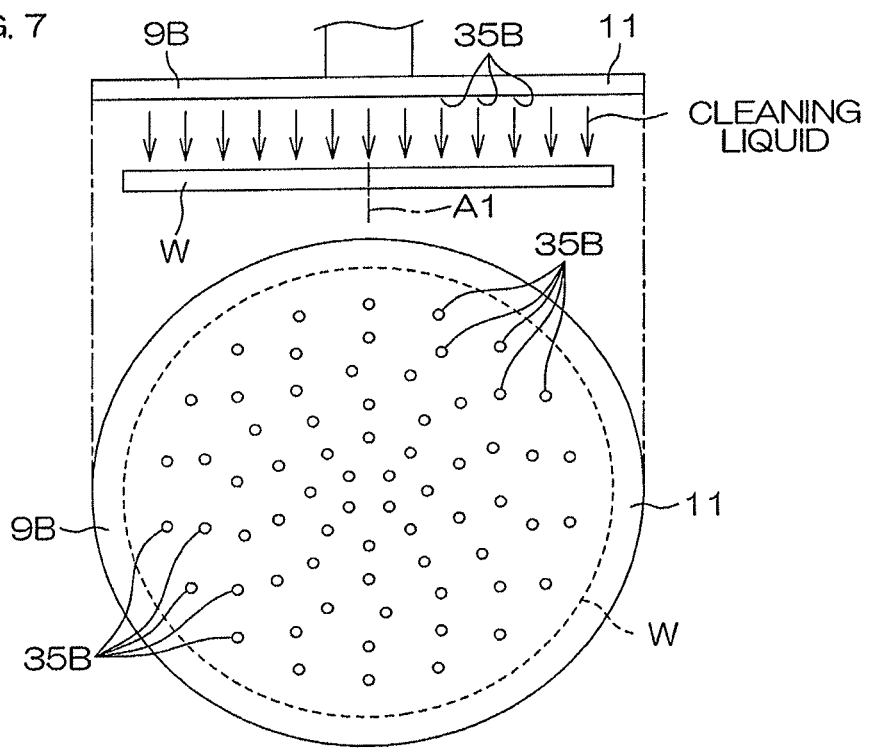
FIG. 7 is a schematic view of a cleaning liquid nozzle according to yet another preferred embodiment of the present invention.

Also in a case where the cleaning liquid nozzle is a fixed nozzle, a cleaning liquid nozzle 9A may have a slit-shaped cleaning liquid discharge port 35A that is longer than a radius of the substrate W as shown in FIG. 6, or a cleaning liquid nozzle 9B may have a plurality of cleaning liquid discharge ports 35B that open at the lower surface of the shield plate 11 and face the entire upper surface of the substrate W as shown in FIG. 7. The same applies to the dissolving liquid nozzle.

In the case where the cleaning liquid nozzle 9A has the slit-shaped cleaning liquid discharge port 35A as shown in FIG. 6, the cleaning liquid discharge port 35A discharges the cleaning liquid toward a rectilinear region passing through the central portion of the upper surface of the substrate W and the peripheral edge portion of the upper surface of the substrate W and therefore the controller 4 can make the spin chuck 6 rotate the substrate W while making the cleaning liquid be discharged from the cleaning liquid nozzle 9A to supply the cleaning liquid to the entire upper surface of the substrate W.

Also, in the case where the cleaning liquid nozzle 9B has the plurality of cleaning liquid discharge ports 35B that open at the lower surface of the shield plate 11 and face the entire upper surface of the substrate W as shown in FIG. 7, the cleaning liquid nozzle 9B that is integral to the shield plate 11 discharges the cleaning liquid toward the entire upper surface of the substrate W and therefore the controller 4 can make the cleaning liquid be discharged from the cleaning liquid nozzle 9B to supply the cleaning liquid to the entire upper surface of the substrate W. In this case, the controller 4 can supply the cleaning liquid uniformly to the entire upper surface of the substrate W by making the spin chuck 6 rotate the substrate W while making the cleaning liquid be discharged from the cleaning liquid nozzle 9B.

Also with the preferred embodiment, a case where the dissolving liquid is supplied to the solute (foam), which solidified due to the evaporation of the solvent, to dissolve and remove the foam from the substrate W was described. However, the processing unit 2 may include a peeling device 49 that physically peels off the foam from the substrate W as shown in FIG. 8.

Figure 8:
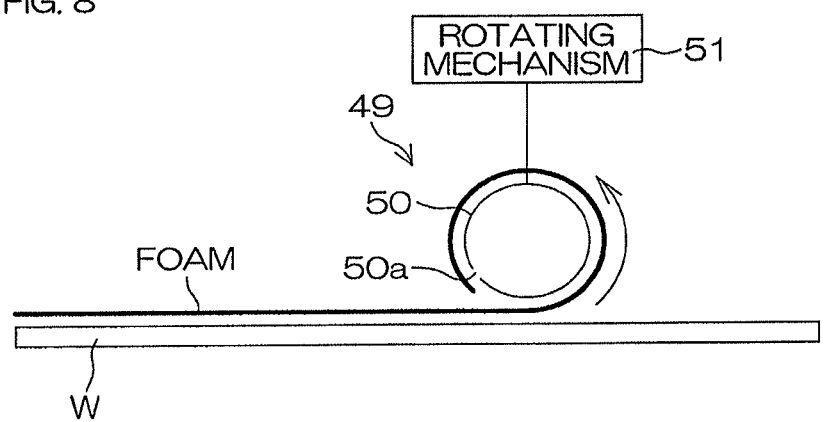
FIG. 8 is a schematic view of a peeling device that peels off a solute, solidified on the substrate, from the substrate.

Specifically, as shown in FIG. 8, the processing unit 2 may include a cylindrical peeling roller 50 having formed therein a slit-shaped suction hole 50a extending in an axial direction and a rotating mechanism 51 that rotates the peeling roller 50 around its central axis. In this case, the controller 4 supplies the cleaning liquid, discharged from the cleaning liquid discharge port 35 (see FIG. 3), to the entire upper surface of the substrate W in the state where the heat and vibration are applied uniformly to the entire substrate W. A film of the foam that covers the entire upper surface of the substrate W is thereby formed. Thereafter, the controller 4 makes the rotating mechanism 51 rotate the peeling roller 50 in a state where the peeling roller 50 is made to suction the film of the foam. The film of the foam is thereby peeled from the substrate W and wound up by the peeling roller 50.

Also with the preferred embodiment, a case where the foaming energy is transmitted from the substrate W to the cleaning liquid by the heating of the substrate W by the heater 20 and the transmission of the vibration to the substrate W was described. However, the cleaning liquid on the substrate W may be heated directly and the vibration may be transmitted directly to the cleaning liquid on the substrate W. In both the case where the foaming energy is applied directly to the cleaning liquid and the case where the foaming energy is applied indirectly to the cleaning liquid, the foaming energy may be applied to the cleaning liquid just by the heating by the heater 20 or just by the transmission of the vibration. Or, the foaming energy may be applied to the cleaning liquid by irradiation of light from a lamp that emits light toward the substrate W. In this case, the irradiation of light may be performed alone or may be performed in parallel to at least one of either of the heating by the heater 20 or the transmission of the vibration.

Also with the processing example of the preferred embodiment, a case where the substrate W is processed in the state where the gas pressure inside the chamber 5 is maintained at the atmospheric pressure was described. However, the substrate W may be processed in the state where the gas pressure inside the chamber 5 is maintained at a pressure lower than the atmospheric pressure to make the foaming agent of the cleaning liquid foam. Also, the substrate W may be processed in the state where the gas pressure inside the chamber 5 is maintained at a pressure higher than the atmospheric pressure to suppress the increase of the thickness of the bubble layer. Such control of the gas pressure may be performed over an entire period during which the substrate W is disposed inside the chamber 5 or may be performed just during a period during which the cleaning liquid is present on the substrate W. Further, such control of the gas pressure may be performed alone or may be performed in parallel to at least one of the heating by the heater 20, the transmission of the vibration, and the irradiation of light.

Also with the processing example of the preferred embodiment, a case where the heating of the substrate W by the heater 20 and the transmission of the vibration to the substrate W are started before the supplying of the cleaning liquid (discharge of the cleaning liquid from the scan nozzle 9) to the substrate W is started and are stopped after the supplying of the cleaning liquid to the substrate W is ended was described. However, the heating by the heater 20 and the transmission of the vibration may be started after the supplying of the cleaning liquid to the substrate W is started. Also, the heating by the heater 20 and the transmission of the vibration may be ended before the supplying of the cleaning liquid to the substrate W is ended. In this case, the controller 4 may control a duration of supplying of the foaming energy to the cleaning liquid and an intensity (temperature, frequency, etc.) of the foaming energy to restrict a region in which the bubble layer is formed to just a region in a vicinity of the front surface of the substrate W (for example, a region of several nm to 100 nm from the front surface of the substrate W). The controller 4 can thereby suppress or prevent the bubble layer from growing to the tip portions of the patterns. Collapsing of the patterns can thus be suppressed or prevented.

Also with the processing example of the preferred embodiment, a case where the discharge of the cleaning liquid and the dissolving liquid from the scan nozzle 9, the discharge of the dissolving liquid from the fixed nozzle, and the discharge of the rinse liquid (pure water) from the fixed nozzle are performed successively in that order was described. However, one of either of the discharge of the dissolving liquid from the scan nozzle 9 and the discharge of the dissolving liquid from the fixed nozzle may be omitted. Also, in a case where the dissolving liquid discharged from the scan nozzle 9 and the fixed nozzle is pure water, one or two among the discharge of the dissolving liquid from the scan nozzle 9, the discharge of the dissolving liquid from the fixed nozzle, and the discharge of the rinse liquid from the fixed nozzle may be omitted.

Also with the processing example of the preferred embodiment, a case where the organic solvent is supplied to the substrate W to replace the rinse liquid on the substrate W by the organic solvent was described (organic solvent supplying step). Further with the preferred embodiment, a case where nitrogen gas is supplied between the substrate W and the shield plate 11 to purge the air from between the substrate Wand the shield plate 11 was described (atmosphere replacing step). However, the drying step may be performed after the rinse liquid is supplied to the substrate W (after the rinse liquid supplying step or the puddle step). Specifically, in the case where the front surface of the substrate W is a hydrophilic surface, a water mark is less likely to form than in the case where the front surface of the substrate W is a hydrophobic surface and therefore in this case, the drying step may be performed after the rinse liquid is supplied to the substrate W.

Also with the processing example of the preferred embodiment, a case where the rinse liquid discharged from the fixed nozzle 7 is supplied to the substrate W was described. However, the rinse liquid discharged from the central axis nozzle 8 may be supplied to the substrate W instead.

Also with the preferred embodiment, a case where the solute that solidifies due to the evaporation of the solvent is contained in the cleaning liquid in addition to the foaming agent and the solvent was described. However, the solute does not have to be a substance that solidifies due to the evaporation of the solvent.

Also, although with the preferred embodiment, a case where the substrate processing apparatus 1 is an apparatus that processes the disk-shaped substrate W was described, the substrate processing apparatus 1 may instead be an apparatus that process a polygonal substrate, such as a liquid crystal display substrate, etc.

While the present invention has been described in detail byway of the embodiments thereof, it should be understood that embodiments are merely illustrative of the technical principles of the present invention but not limitative of the invention. The spirit and scope of the present invention are to be limited only by the appended claims.

This application corresponds to Japanese Patent Application No. 2012-134083 filed in the Japan Patent Office on Jun. 13, 2012, and Japanese Patent Application No. 2013-010461 filed in the Japanese Patent Office on Jan. 23, 2013, the disclosures of which are incorporated herein by reference in its entirety.

What is claimed is:

1. A substrate processing method comprising:
   a cleaning liquid supplying step of supplying a cleaning liquid to a substrate, the cleaning liquid containing a foaming agent that foams due to application of foaming energy; and
   a foaming energy supplying step of applying the foaming energy to the cleaning liquid in contact with the substrate;
   wherein the cleaning liquid supplied to the substrate in the cleaning liquid supplying step contains the foaming agent that foams due to application of the foaming energy, a solvent that evaporates due to application of the foaming energy, and a solute that solidifies due to evaporation of the solvent.

2. The substrate processing method according to claim 1 wherein the foaming energy supplying step includes a step of applying the foaming energy to the substrate to make the foaming energy be transmitted from the substrate to the cleaning liquid.

3. The substrate processing method according to claim 1 wherein the foaming energy supplying step includes an energy supply amount controlling step of controlling an amount of the foaming energy applied to the cleaning liquid.

4. The substrate processing method according to claim 1 further comprising a dissolving liquid supplying step of supplying a dissolving liquid which dissolves the solute of the cleaning liquid to the substrate after the cleaning liquid supplying step and the foaming energy supplying step.

5. The substrate processing method according to claim 1 wherein the foaming energy supplying step is a step of supplying the foaming energy to the cleaning liquid by means of at least one of a heat generating unit which generates heat that is transmitted to the cleaning liquid, a vibrating unit which generates vibration that is transmitted to the cleaning liquid, a gas pressure changing unit which changes a gas pressure of a space in which the substrate is disposed, and a light irradiating unit which irradiates light toward the substrate.

\* \* \* \* \*